(12) United States Patent
Winkler et al.

(10) Patent No.: US 11,359,286 B2
(45) Date of Patent: Jun. 14, 2022

(54) QUARTZ CRYSTAL MICROBALANCE CONCENTRATION MONITOR

(71) Applicant: Applied Materials, Inc., Santa Clara, CA (US)

(72) Inventors: Jereld Winkler, Gilbert, AZ (US); Mohith Verghese, Phoenix, AZ (US)

(73) Assignee: Applied Materials, Inc., Santa Clara, CA (US)

( * ) Notice: Subject to any disclaimer, the term of this patent is extended or adjusted under 35 U.S.C. 154(b) by 273 days.

(21) Appl. No.: 16/864,877

(22) Filed: May 1, 2020

(65) Prior Publication Data

US 2021/0340674 A1 Nov. 4, 2021

(51) Int. Cl.
| | |
|---|---|
| *H01L 21/00* | (2006.01) |
| *C23C 16/52* | (2006.01) |
| *C23C 16/455* | (2006.01) |
| *H01L 21/02* | (2006.01) |
| *H01L 21/66* | (2006.01) |
| *C23C 16/44* | (2006.01) |

(52) U.S. Cl.
CPC .......... *C23C 16/52* (2013.01); *C23C 16/4408* (2013.01); *C23C 16/45544* (2013.01); *H01L 21/0228* (2013.01); *H01L 22/26* (2013.01)

(58) Field of Classification Search
CPC ..... H01L 21/0228; H01L 22/26; C23C 16/52; C23C 16/4408; C23C 16/45544
USPC ........................................................... 438/5
See application file for complete search history.

(56) References Cited

U.S. PATENT DOCUMENTS

| | | | |
|---|---|---|---|
| 6,156,578 A | 12/2000 | Tom | |
| 6,295,861 B1 | 10/2001 | Tom et al. | |
| 6,911,092 B2* | 6/2005 | Sneh | ................ H01L 21/67126 118/733 |
| 7,662,233 B2* | 2/2010 | Sneh | ................ C23C 16/4488 118/724 |
| 2008/0044573 A1 | 2/2008 | Chen et al. | |
| 2012/0104703 A1 | 5/2012 | Sun et al. | |
| 2018/0082871 A1 | 3/2018 | Finlay et al. | |

FOREIGN PATENT DOCUMENTS

| | | |
|---|---|---|
| JP | 2010271224 A | 12/2010 |
| WO | 2019040843 A1 | 2/2019 |

OTHER PUBLICATIONS

PCT International Search Report and Written Opinion in PCT/US2021/030122 dated Aug. 25, 2021, 10 pages.

* cited by examiner

*Primary Examiner* — Luan C Thai
(74) *Attorney, Agent, or Firm* — Servilla Whitney LLC (57) ABSTRACT

Describe is a quartz crystal microbalance (QCM) device mounted within a heated sample chamber. The sample chamber temperature is maintained about 10° C. to about 30° C. greater than the temperature of the precursor vessel. The sample chamber is connected to the precursor delivery line and includes a high temperature valve and a flow pathway to foreline with a high temperature valve to permit removal of excess material. The QCM device includes a heater and gas cooling channel allowing the device to be maintained at a temperature about 10° C. to about 30° C. less than the temperature of the precursor vessel.

20 Claims, 4 Drawing Sheets

QUARTZ CRYSTAL MICROBALANCE CONCENTRATION MONITOR

TECHNICAL FIELD

Embodiments of the disclosure generally relate to semiconductor processing and other electronics fabrication. More particularly, embodiments of the disclosure are directed to methods and apparatus for controlling chemical precursor delivering to a processing chamber.

BACKGROUND

As integrated circuit (IC) density increases, the need for greater uniformity and process control regarding layer thickness rises. The IC fabricators make aggressive demands on the semiconductor processing industry to develop fabrication tools that provide for larger production yields while increasing the uniformity of layers deposited on substrates having increasingly larger surface areas. In response to these demands, various technologies have been developed to deposit layers on substrates in a cost-effective manner, while maintaining control over the characteristics of the layer.

Both chemical vapor deposition (CVD) and atomic layer deposition (ALD) techniques require precise control of reactive precursors introduced into the process chamber in order to produce a desired layer of uniform thickness. For some applications of CVD and ALD, one or more of the precursors come in the state of a solid or a liquid. Typically, the precursor changes state from a solid to a gas (vaporizes) at a certain pressure and temperature via a sublimation process carried out within a storage vessel. The precursor may be delivered to the process chamber via a process gas produced by flowing a carrier gas through the vessel, or the precursor may be delivered without a process. The process gas comprises the vaporized precursor mixed with the carrier gas. The rate of sublimation depends on a temperature of the precursor, a surface area and morphology of the precursor, and how the carrier gas flows through the vessel (flow dynamics and residence time), each of which may be very difficult to control. Accordingly, it is often difficult to deliver a predictable concentration of the precursor to the process chamber.

A need exists, therefore, for an improved method for monitoring and adjusting the dose/concentration of the precursor to a processing chamber.

SUMMARY

One or more embodiments of the disclosure are directed to a processing system. In one embodiment, the processing system comprises: a carrier gas source; a precursor vessel; a deposition chamber; and a sample chamber downstream of the precursor vessel and upstream of the deposition chamber, the sample chamber housing a quartz crystal microbalance (QCM) device.

Another embodiment of the disclosure is directed to a processing method. In one or more embodiments, a processing method comprises: heating a vessel containing a chemical precursor to a temperature in a range of from about 25° C. to about 600° C., the vessel having a first precursor concentration; flowing a carrier gas through the vessel to form a precursor gas comprising the chemical precursor; measuring a concentration of the chemical precursor within the precursor gas using a quartz crystal microbalance (QCM) device within a sample chamber, the precursor having a second precursor concentration, and the sample chamber having a temperature in a range of from about 10° C. to about 30° C. greater than the temperature of the vessel; exposing a substrate to the precursor gas during a deposition process; and depositing a film on the substrate.

Other embodiments of the disclosure are directed to a non-transitory computer readable medium including instructions, that, when executed by a controller of a processing chamber, causes the processing chamber to perform operations of: heat a vessel containing a chemical precursor to a temperature in a range of from about 10° C. to about 600° C.; flow a carrier gas through the vessel to form a precursor gas comprising the chemical precursor; measure a concentration of the chemical precursor within the precursor gas using a quartz crystal microbalance (QCM) within a sample chamber, the sample chamber having a temperature in a range of from about 10° C. to about 30° C. greater than the temperature of the vessel; expose a substrate to the precursor gas during a deposition process; and deposit a film on the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon carbide, silicon oxide, strained silicon, silicon on insulator (SOI), carbon doped silicon oxides, silicon nitride, doped silicon, germanium, gallium arsenide, glass, sapphire, quartz, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used.

As used in this specification and the appended claims, the terms "precursor", "reactant", "reactive gas" and the like are used interchangeably to refer to any gaseous species that can react with the substrate surface.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

One or more embodiments advantageously provide a processing system which utilizes a quartz crystal microbalance (QCM) to monitor precursor concentration output throughout the lifetime of the precursor in the vessel. Monitoring the precursor concentration ensures that the same amount of precursor is delivered to the substrate from one pulse to another and from one wafer to the next, ensuring quality of the process and overall yield of the wafer. Monitoring of precursor concentration also ensures that one is aware of depletion of the source to prevent wafer scrap in case precursor runs out or is depleted.

As used herein, the term "quartz crystal microbalances (QCM)" refers to an electronic device that is traditionally used within vacuum deposition chambers to measure thin film thickness on substrates. QCMs measure film thickness by tracking the frequency response of a quartz crystal during the coating process. This frequency change can be related to the amount of coating material on the crystal surface. Quartz crystals monitor thickness at the Angstrom level. This extreme level of precision accuracy is critical because thickness deviations as little as 10 Angstroms can have a major effect on product performance.

Currently, quartz crystal microbalance (QCM) systems are located within the precursor vessel itself and provide no information on the actual concentration output downstream of the vessel. Additionally, in current systems, the quartz crystal microbalance (QCM) occupies space within the vessel, thereby increasing vessel footprint and limiting vessel capacity. Other concentration monitor systems include optical (infrared and ultraviolet spectroscopy), acoustic, mass spectroscopy, gas chromatography systems. All of these systems techniques have drawbacks and costs including large footprint, inability to measure outside a narrow temperature flow or pressure range, dependent on carrier gas time, and limited to 150° C. *maximum* temperature.

Figure 1:
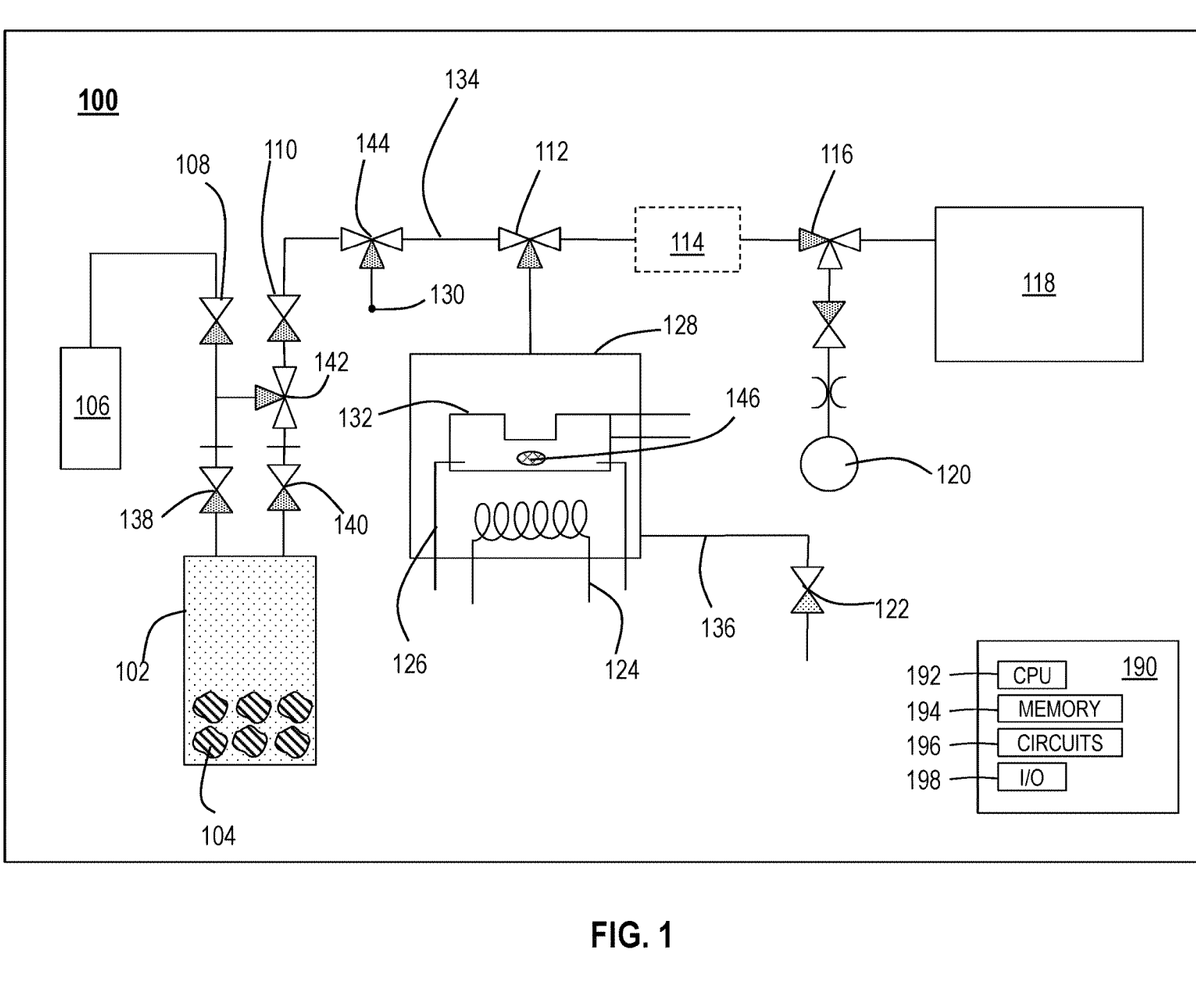
FIG. 1 illustrates a schematic of a processing system in accordance with one or more embodiments of the disclosure.

Accordingly, one or more embodiments advantageously provide a quartz crystal microbalance (QCM) monitoring system that monitors downstream of the vessel outlet but upstream of a reaction chamber that houses the wafer/substrate, thus capturing both changes in sublimation/evaporation rate and physical failures, such as, but not limited to, clogging or valving conductance changes. The quartz crystal microbalance (QCM) monitoring system of one or more embodiments has a wide operational temperature, a wide flow and pressure range, has a small footprint, and is compatible with harsh chemistries. Without intending to be bound by theory, it is thought that placing the QCM upstream the deposition chamber, whereas most applications have the QCM in the deposition chamber or downstream of the deposition chamber, allows for measurement on a condensed single precursor as opposed to deposited film FIG. 1 illustrates a schematic of a processing system 100 in accordance with one or more embodiments of the disclosure. Referring to FIG. 1, the system 100 includes a carrier gas source 106, a deposition chamber 118, an optional reservoir 114, a quartz crystal microbalance (QCM) sample chamber 128, a precursor vessel 102, and a controller 190.

In one or more embodiments, the deposition chamber 118 may be any suitable semiconductor deposition chamber, such as a chemical vapor deposition (CVD) chamber, atomic layer deposition (ALD) chamber, plasma enhanced chemical vapor deposition (PECVD) chamber or etch chamber.

Examples of suitable process chambers include, but are not limited to, the PRODUCER® series of CVD chambers, the SPRINT® and ENDURA® Series of CVD/ALD chambers and the CENTURA® series of ALD/CVD and etch chambers, available from Applied Materials, Inc., located in Santa Clara, Calif.

The system 100 transports a precursor 104 from a precursor vessel 102 to the deposition chamber 118 via a carrier gas stored in the carrier gas source 106. In one or more embodiments, a carrier gas is option if the precursor has sufficient vapor pressure to provide enough concentration to the reaction chamber. In one or more embodiments, the precursor 104 changes state from a solid to a gas (or vapor) in the vessel 102 by a sublimation process, or the precursor 104 changes from a liquid to a gas by an evaporation process in the vessel 102. The precursor 104 may have a gas or fluid state. The vaporization process (i.e., sublimation or evaporation) for the precursor 104 may be initiated by any suitable well-known technique. For example, the precursor 104 may be heated to a predetermined temperature or mixed with a bubbling liquid within the vessel 102. In one or more embodiments, the temperature of the vessel 102 may be controlled in an effort to regulate the vaporization process. The vessel 102 and the precursor 104 are maintained in a temperature range of from about 10° C. to about 600° C., or in a range of from about 25° C. to about 300° C., or in a range from about 50° C. to about 150° C. In one or more embodiments, the precursor source may be cooled if the vapor pressure is sufficiently high. For example, in one or more embodiments, silicon tetrachloride ($SiCl_4$) may be cooled to about 15° C. because the resultant vapor pressure is sufficient to dose a 300 mm wafer.

In one or more embodiments, the precursor vessel 102 may be any suitable container, for example, capable of withstanding the pressure and temperature required to vaporize the precursor 104. In some embodiments, the vessel 102 may comprises a bubbler (not illustrated). In one or more embodiments, the precursor vessel 102 is made from a material that is non-reactive to the precursor 104. Suitable materials to manufacture the precursor vessel 102 include, but are not limited to, steel (e.g. stainless steel), aluminum, aluminum alloy, or nickel, and the like. In one or more embodiments, the precursor vessel 102 may contain a lining to enhance the chemical protection, such as, but not limited to, PTFE, nickel, magnesium fluoride, or glass. In one or more embodiments, the precursor vessel 102 may be an ampoule.

In one or more embodiments, the carrier gas source 106 houses a carrier gas that flows through a first valve 108. As used herein, the term "carrier gas" refers to a fluid (either gas or liquid) that can move a precursor molecule from one location to another. In some embodiments, a carrier gas is an inert gas. In one or more embodiments, a carrier gas is one or more of argon (Ar), helium (He), xenon (Xe), hydrogen ($H_2$), or nitrogen ($N_2$).

In one or more embodiments, from the first valve 108, the carrier gas can move through a second valve 138 into the precursor vessel 102 to mix with the vaporized precursor 104, forming a precursor gas, which exits the precursor vessel 102 through third valve 140. In one or more embodiments, the carrier gas has a flow rate in a range of from about 10 sccm to about 5000 sccm, or in a range of from about 50 sccm, to about 1000 sccm. The carrier gas mixes with the precursor 104 and exits the precursor vessel 102 as the precursor gas.

In other embodiments, fourth valve 142 is a bypass valve that bypasses the vessel entirely and just flows the carrier gas to the deposition chamber 118. Thus, in one or more embodiments, the flow of carrier gas bypasses the precursor vessel 102 and flows through the fifth valve 110 and through 144 and flows to the sample valve 112, where the carrier gas flows into the sample chamber 128. In one or more embodiments, sample valve 112 is a 3-way valve, as illustrated. In other embodiments, sample valve 112 is a 2-way valve. In one or more embodiments, the carrier gas has a flow rate in the range of from about 10 sccm to about 5,000 sccm, or in a range of from about 50 sccm to about 1,000 sccm. The mixing of carrier gas and the precursor 104 forms a process gas with a flow rate in the range of from about 10 sccm to about 5,000 sccm, or from about 50 sccm to about 1,000 sccm.

In one or more embodiments, the carrier gas source 106 supplies inert carrier gas flow through the precursor vessel 102. In one or more embodiments, the carrier gas flow pressurizes the precursor vessel 102 and entrains sublimated precursor. In one or more embodiments, the concentration of precursor 104 is defined as the ratio of the vapor pressure generated by heating the vessel 102 to vessel total pressure supplied by the carrier gas. In one or more embodiments, pressure drops occur downstream of the vessel defined by the flow coefficient (Cv) of the delivery system and components, however, the partial pressure of precursor 104 is maintained. For ALD applications, the pulsing sequence typically pulses the vessel inlet/outlet valves 108/110 and sample valve 112 simultaneously allowing precursor and carrier gas mixture to be delivered to the sample chamber 128. With solid precursors, the amount entrained in carrier gas (pick up) can change depending upon the length of time at temperature or usage. In one or more embodiments, the change in dose can be detrimental to film performance and typically is only detected by on wafer measurement which can lead to multiple wafer scrap.

In one or more embodiments, a quartz crystal microbalance (QCM) housing 132 is mounted within a quartz crystal microbalance (QCM) sample chamber 128. In one or more embodiments, the quartz crystal microbalance (QCM) sample chamber 128 is heated by a heater 124. In one or more embodiments, the sample chamber 128 temperature is maintained in a temperature range of from about 10° C. to about 30° C. greater than the precursor vessel 102 temperature. In one or more embodiments, the QCM is maintained at a lower temperature to enable condensation. In one or more embodiments, however, will have the ability to heat to a higher temperature as well to clean the crystal. The sample chamber may be held as higher temperature to ensure condensation occurs on the crystal and not on the sample chamber housing. In one or more embodiments, the sample chamber 128 is connected to the precursor delivery line 134 and includes a high temperature valve 122 and includes a flow pathway to a foreline 136 with a high temperature valve 122 to allow removal of excess material. In one or more embodiments, the QCM housing 132 includes a heater 124 and a gas cooling channel 126, allowing the QCM housing 132 to be maintained in a temperature range of from about 10° C. to about 30° C. less than the precursor vessel 102 temperature.

In one or more embodiments, the QCM can measure the condensation of one species of precursor. This is unlike traditional applications for QCMs where film deposition is measured (i.e. the resultant film and not just one species). The ability to measure a single species (through condensation) is important as the QCM can be reset by heating the crystal and subliming off the condensed precursor. This allows operation of the crystal 146 indefinitely, and the crystal 146 should not have to be changed out.

In one or more embodiments, prior to the start of the deposition process, the sample valve 112 is opened for a fixed time allowing a fixed amount of precursor 104 in the carrier gas to flow or diffuse from the delivery line 134 into the sample chamber 128. Since the QCM housing 132 is maintained at a lower temperature compared to the precursor vessel 102, the precursor 104 will condense only on the QCM crystal 146, resulting in a mass gain. The mass gain can then be compared to a baseline reading. In one or more embodiments, if the concentration delivered from the precursor vessel 102 changes, the mass gain reported will deviate from baseline, and the deposition process may be interrupted, preventing wafer/substrate damage. In one or more embodiments, a baseline is established and the QCM mass gain can be checked against the baseline prior to every wafer or every lot. In one or more embodiments, the QCM can be exposed every single ALD pulse to check concentration variation from pulse to pulse.

In one or more embodiments, the quartz crystal microbalance (QCM) measures the concentration of the precursor gas outside of the precursor vessel. This measurement may occur in a time frame of less than about 100 milliseconds, or less than about 90 milliseconds, or less than about 80 milliseconds, or less than about 70 milliseconds, or less than about 60 milliseconds, or less than about 50 milliseconds. In one or more embodiments, pulse lengths can be between about 50 milli-seconds and several seconds long (up to about 20 seconds).

In one or more embodiments, a reservoir 114 can be used to build up precursor dose to push a larger dose to the deposition chamber 118. Alternatively, reservoir 114 can be used to smooth out pressure variations during pulsing. A purge gas 120 may be introduced at 116 between the delivery of each precursor gas to ensure that the only reactions that occur are on the substrate surface. In one or more embodiments, the purge gas comprises any suitable gas, including, but not limited to argon (Ar), helium (He), nitrogen ($N_2$), and hydrogen ($H_2$). In some embodiments, the purge gas comprises nitrogen ($N_2$).

In one or more embodiments, the system 100 includes a controller 190. In an exemplary embodiment, the controller 190 includes a hard disk drive, a floppy disk drive, and a processor.

In one or more embodiments, the controller 190 controls all of the activities of the system 100. The controller 190 executes system control software, which is a computer program stored in a computer-readable medium. The medium may be a hard disk drive, or other kinds of memory. The computer program includes sets of instructions that dictate the timing, mixture of gases, chamber pressures, chamber temperatures, RF power levels, and other parameters of a particular process. Other computer programs stored on other memory devices including, for example, a floppy disk or other another appropriate drive, may also be used to instruct the system controller.

The controller 190 includes a central processing unit (CPU) 192, a memory 194, one or more support circuits 196 utilized to control the process sequence and regulate the gas flows, and an input/output (I/O) 198. The CPU 192 may be of any form of a general-purpose computer processor that may be used in an industrial setting. The software routines can be stored in the memory 194, such as random access memory, read only memory, floppy, or hard disk drive, or other form of digital storage. The support circuit 196 is conventionally coupled to the CPU 192 and may include cache, clock circuits, input/output systems, power supplies, and the like.

The memory 194 can include one or more of transitory memory (e.g., random access memory) and non-transitory memory (e.g., storage). The memory 194, or computer-readable medium, of the processor may be one or more of readily available memory such as random access memory (RAM), read-only memory (ROM), floppy disk, hard disk, or any other form of digital storage, local or remote. The memory 194 can retain an instruction set that is operable by the processor to control parameters and components of the system.

Processes may generally be stored in the memory 194 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller 190) that controls the chamber operation such that the processes are performed.

The controller 190 of some embodiments is configured to interact with hardware to perform the programmed function. For example, the controller 190 can be configured to control one or more valves, motors, actuators, power supplies, etc. In some embodiments, a controller 190 is coupled to the deposition chamber 118. The controller 190 has one or more configurations to control the various functions and processes.

Figure 2:
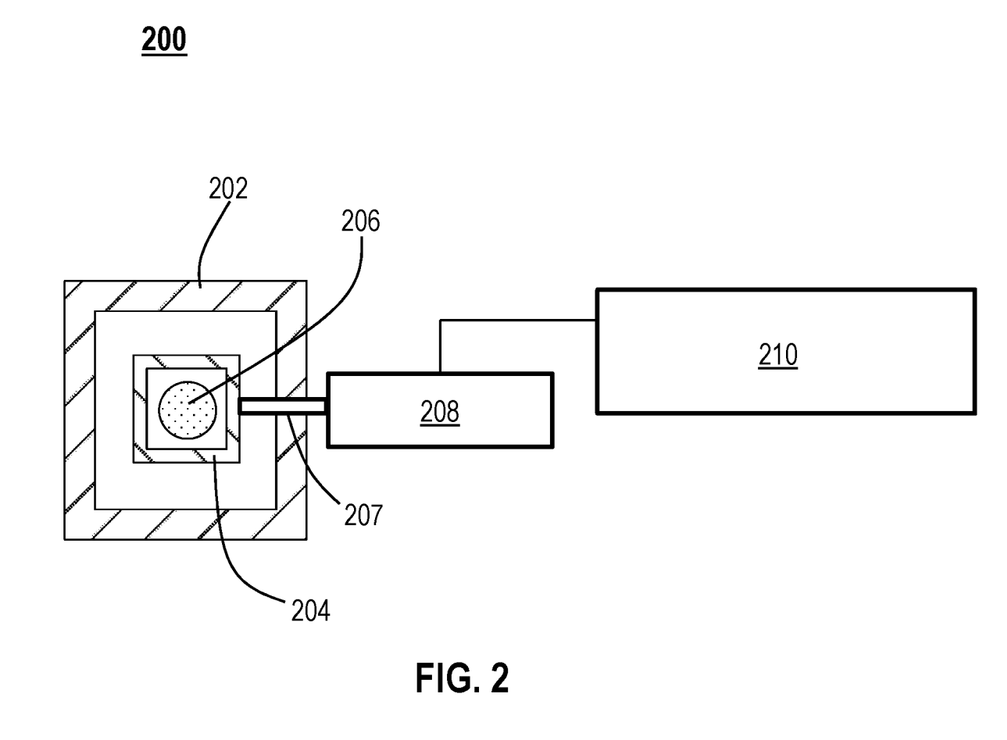
FIG. 2 illustrates a schematic of quartz crystal microbalance (QCM) device in accordance with one or more embodiments of the disclosure.

FIG. 2 illustrates a schematic of quartz crystal microbalance (QCM) device 200 in accordance with one or more embodiments of the disclosure. Quartz crystal microbalances (QCMs) are electronic devices used within vacuum deposition chambers to measure thin film thickness on substrates.

Referring to FIG. 2, in one or more embodiments, the quartz crystal microbalance (QCM) device is contained partially within a vacuum chamber and partially outside. The in-vacuum components are a crystal 206, a crystal holder 204, a sensor head 202 (with the electrical connection, water lines, thermocouple and heating elements) and a feed-through 207, which connects the internal components with the air side. The external components include: cables and fittings (not illustrated) from the feedthrough 207, an oscillator 208, which makes the crystal 206 vibrate and measures the vibration continuously, and the frequency counter 210, which displays and acts upon this information.

In one or more embodiments, there are two type of quartz crystals 206 used in film thickness measurement, AT and RC types. The AT crystal is characterized through the molecular tetrahedral quartz crystal structure and single angle cut (35 or 15 units from the Z-direction), which allows it to vibrate when a voltage is applied to it. The frequency that the AT crystal exhibits naturally is constant until a few angstroms of material have been deposited onto it, changing that frequency. The frequency of the AT crystal is sensitive to temperature and internal deposited material stress. Although the AT crystal can be used in processes up to 100° C., it is better suited for low temperature measurements. The RC crystal, on the other hand, does not as easily show a frequency response to internal stress or high temperatures, and predominately responds to only film accumulation on the surface. The RC crystal can effectively measure films without any degradation of the measurement integrity. Furthermore, the RC crystal has a frequency temperature turning curve of 300° C.

Crystals are shaped so that one side is flat and one side has a curve, or piano-convex. The reason for this shape is to keep the crystal vibration at the center and not the edges of the crystal. A plano-convex crystal can be mounted into a holder 204 without affecting the vibration. This curvature is vital to proper operation as a piano-piano or flat crystal will not accurately vibrate.

In the one or more embodiments, the sensor head 202 is the mechanical assembly where the crystal is placed and electrical contacts connect the crystal to an oscillator 208. In some embodiments, the sensor head 202 contains water or air lines for cooling, a heater for changing the sensor head 202 temperature, and a thermocouple. Crystals are temperature sensitive and require temperature control at all times. In one or more embodiments, the sensor head 202 is "demountable," meaning the crystal assembly is replaceable. This may be accomplished by using a cap, or holder for the crystal itself, which mounts into a sensor body. The sensor body has a center contact spring that pushes against the backside of the crystal cap making an electrical circuit. The body of the sensor is the electrical "ground" or return path. In one or more embodiments, a heating element (not illustrated) is added to the sensor head 202. Combined with a thermocouple, or temperature measurement device, a heating element allows for the control of the sensor head 202 temperature in real time. In one or more embodiments, the sensor head 202 can hold from 1 to 24 crystals. Accordingly, if a crystal 206 fails, or stops operating, the process may continue to be monitored without opening the chamber. In one or more embodiments, the sensor head holds one crystal, and, advantageously, only one crystal is used during the deposition process.

In one or more embodiments, the feedthrough 207 is the metal assembly that connects the sensor head 202 and its electrical and liquid or airlines through the vacuum chamber wall. In one or more embodiments, the oscillator 208 is an electrical circuit that forces the crystal 206 into vibration or "oscillation." The oscillator 208 does this by finding a natural, or resonance, frequency for the crystal 206, and tracking it as this frequency changes with the addition of coating. In one or more embodiments, the oscillator 208 is placed close to the feedthrough 207 (within about 6 inches to about 10 inches) because the crystal connecting cables (not illustrated) make up part of the oscillating circuit. If crystal connecting cables are too long, they weaken the strength of the vibration and the crystal measurement becomes erratic.

In one or more embodiments, the frequency counter 210 is a microprocessor based electronic instrument that takes the frequency information from the oscillator 208, through a coaxial cable, and uses it to calculate the film thickness or rate of thickness being deposited. The algorithm, or formula used, is called the Sauerbrey or modified Sauerbrey equation. This formula relates the mass or weight of the film with the change in resonance frequency of the crystal. As more mass is deposited on the crystal, the vibration slows down. This change can be used to calculate the thickness from the mass.

In one or more embodiments, the frequency counter 210 can be tied back into the reaction chamber control architecture 190 so that the signals can be read from the tool GUI. This way, actions/corrections can be made on the tool to adjust processing according to the measurement on the QCM. Actions may include adjusting carrier flow rate, adjusting precursor vessel temperatures or ceasing processing of current or future wafers if concentration is outside of required limits.

Figure 3:
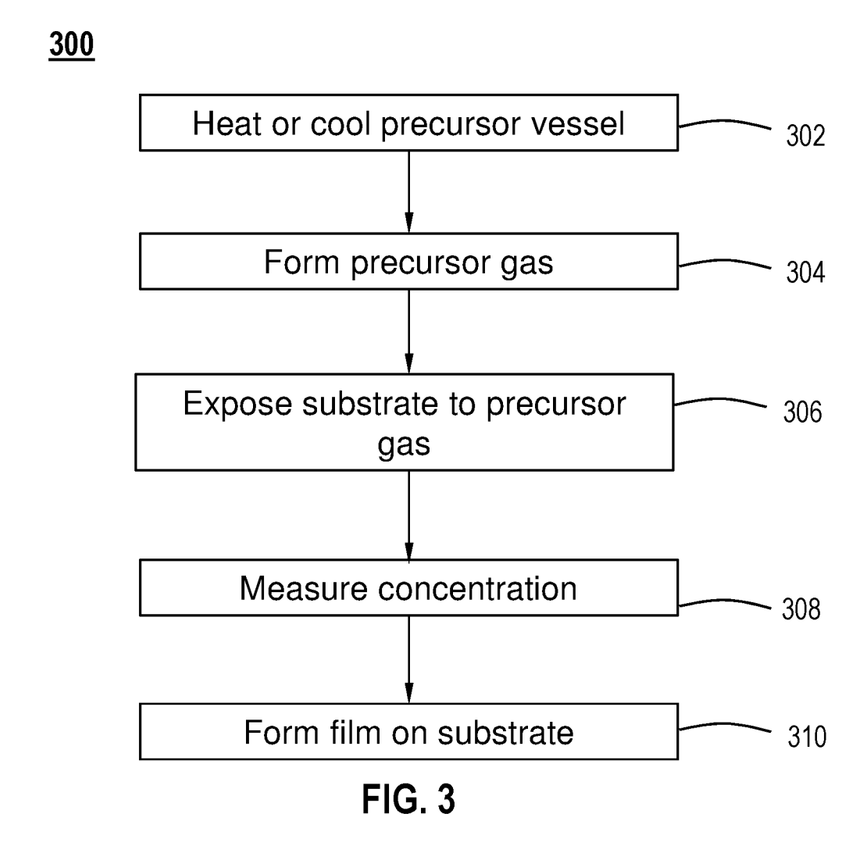
FIG. 3 depicts a process flow diagram of a processing method in accordance with one or more embodiments of the disclosure.

FIG. 3 depicts a process flow diagram of an example method 300 for depositing a film in accordance with one or more embodiments of the present disclosure. With reference to FIG. 3, at operation 302 a precursor vessel containing a chemical precursor is heated or cooled to a temperature in a range of from about 10° C. to about 600° C., or in a range of from about 25° C. to about 300° C., or in a range of from about 50° C. to about 150° C. The precursor has a first precursor concentration. At operation 304, a precursor gas is formed by flowing carrier gas through the precursor vessel comprising the chemical precursor. At operation 306, a substrate is exposed to the precursor gas during a deposition process. At operation 308, the concentration of the chemical precursor within the precursor gas, after the precursor gas has exited the precursor vessel, is measured. The measurement of the concentration can be performed using a quartz crystal microbalance (QCM) device within a sample chamber. The precursor in the precursor gas, has a second precursor concentration, and the sample chamber has a temperature in a range of from about 10° C. to about 15° C. greater than the temperature of the precursor vessel. In one or more embodiments, measuring the concentration of the chemical precursor within the precursor gas is conducted in a time frame of less than about 100 milliseconds, or in a time frame of about 50 milliseconds to about 20 seconds. At operation 310, a film is formed on the substrate. In some embodiments, heating the vessel vaporizes the chemical precursor. In one or more embodiments, the quartz crystal microbalance (QCM) device has a temperature in a range of from about 10° C. to about 30° C. less than the temperature of the vessel.

Figure 4:
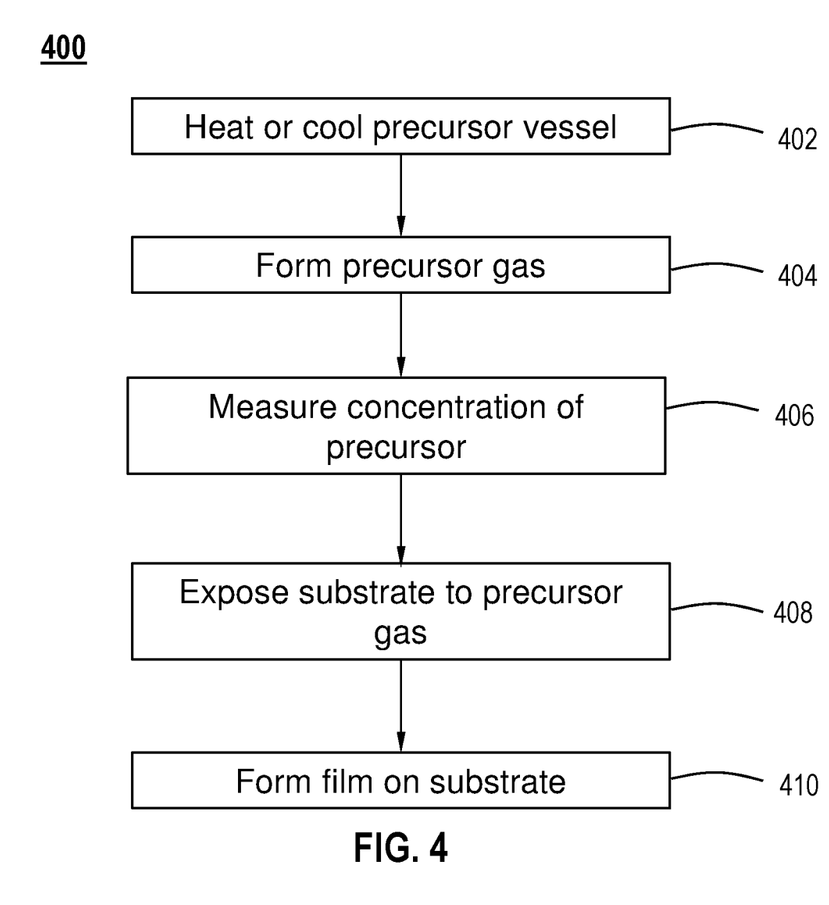
FIG. 4 depicts a process flow diagram of a processing method in accordance with one or more embodiments of the disclosure.

FIG. 4 depicts a process flow diagram of an example method 400 for depositing a film in accordance with one or more embodiments of the present disclosure. In one or more embodiments, the QCM can be used to sense concentration prior to moving the substrate into the reaction chamber (as a health check on the precursor vessel). With reference to FIG. 4, at operation 402 a precursor vessel containing a chemical precursor is heated or cooled to a temperature in a range of from about 10° C. to about 600° C., or in a grange of from about 25° C. to about 300° C., or in a range of from about 50° C. to about 150° C. The precursor has a first precursor concentration. At operation 404, a precursor gas is formed by flowing carrier gas through the precursor vessel comprising the chemical precursor. At operation 406, the concentration of the chemical precursor within the precursor gas, after the precursor gas has exited the precursor vessel, is measured. The measurement of the concentration can be performed using a quartz crystal microbalance (QCM) device within a sample chamber. The precursor in the precursor gas, has a second precursor concentration, and the sample chamber has a temperature in a range of from about 10° C. to about 15° C. greater than the temperature of the precursor vessel. In one or more embodiments, measuring the concentration of the chemical precursor within the precursor gas is conducted in a time frame of less than about 100 milliseconds, or in a time frame of about 50 milliseconds to about 20 seconds. At operation 408, a substrate is exposed to the precursor gas during a deposition process. At operation 410, a film is formed on the substrate. In some embodiments, heating the vessel vaporizes the chemical precursor. In one or more embodiments, the quartz crystal microbalance (QCM) device has a temperature in a range of from about 10° C. to about 30° C. less than the temperature of the vessel.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing system comprising:
a carrier gas source;
a precursor vessel;
a deposition chamber; and
a sample chamber downstream of the precursor vessel and upstream of the deposition chamber, the sample chamber housing a quartz crystal microbalance (QCM) device.

2. The processing system of claim 1, wherein the deposition chamber is selected from one or more of an atomic layer deposition (ALD) chamber, or a chemical vapor deposition (CVD) chamber.

3. The processing system of claim 1, further comprising a heater and a gas cooling channel within the sample chamber.

4. The processing system of claim 1, wherein the carrier gas source comprises a carrier gas selected from one or more of argon (Ar), helium (He), xenon (Xe), hydrogen ($H_2$), and nitrogen ($N_2$).

5. The processing system of claim 1, wherein the quartz crystal microbalance (QCM) device comprises one or more of a sensor head, a crystal holder, a crystal, a feedthrough, an oscillator, and a frequency counter.

6. The processing system of claim 5, wherein the crystal comprises one or more of an AT crystal or a RC crystal.

7. The processing system of claim 5, comprising a range of from 1 to 24 crystals.

8. The processing system of claim 1, further comprising a controller.

9. The processing system of claim 8, wherein the controller comprises one or more of a central processing unit (CPU), a memory, circuits, and an input/output.

10. The processing system of claim 1, further comprising a purge gas source and a reservoir, the reservoir downstream of the precursor vessel and the sample chamber and upstream of the deposition chamber.

11. The processing system of claim 10, wherein the purge gas source comprises a purge gas selected from one or more of argon (Ar), helium (He), xenon (Xe), hydrogen ($H_2$), and nitrogen ($N_2$).

12. The processing system of claim 1, wherein the precursor vessel is an ampoule.

13. The processing system of claim 1, wherein the precursor vessel contains a precursor selected from one or more of a solid precursor or a liquid precursor.

14. A processing method comprising:
heating a vessel containing a chemical precursor to a temperature in a range of from about 10° C. to about 600° C., the vessel having a first precursor concentration;
flowing a carrier gas through the vessel to form a precursor gas comprising the chemical precursor;
measuring a concentration of the chemical precursor within the precursor gas using a quartz crystal microbalance (QCM) device within a sample chamber, the chemical precursor having a second precursor concentration, and the sample chamber having a temperature in a range of from about 10° C. to about 30° C. greater than the temperature of the vessel;
exposing a substrate to the precursor gas during a deposition process; and
depositing a film on the substrate.

15. The processing method of claim 14, wherein heating the vessel vaporizes the chemical precursor.

16. The processing method of claim 14, wherein the quartz crystal microbalance (QCM) device has a temperature in a range of from about 10° C. to about 15° C. less than the temperature of the vessel.

17. The processing method of claim 14, wherein the measuring the concentration of the chemical precursor within the precursor gas is conducted in a time frame of about 50 milliseconds to about 20 seconds.

18. A non-transitory computer readable medium including instructions, that, when executed by a controller of a processing system, causes the processing system to perform operations of:
heat a vessel containing a chemical precursor to a temperature in a range of from about 25° C. to about 600° C.;
flow a carrier gas through the vessel to form a precursor gas comprising the chemical precursor;
measure a concentration of the chemical precursor within the precursor gas using a quartz crystal microbalance (QCM) within a sample chamber, the sample chamber having a temperature in a range of from about 10° C. to about 30° C. greater than the temperature of the vessel;
expose a substrate to the precursor gas during a deposition process; and
deposit a film on the substrate.

19. The non-transitory computer readable medium of claim 18, wherein the quartz crystal microbalance (QCM) device has a temperature in a range of from about 10° C. to about 30° C. less than the temperature of the vessel.

20. The non-transitory computer readable medium of claim 19, wherein the measuring the concentration of the chemical precursor within the precursor gas is conducted in a time frame of less than about 100 milliseconds.

* * * * *